(12) United States Patent
Kim et al.

(10) Patent No.: US 9,525,151 B2
(45) Date of Patent: Dec. 20, 2016

(54) ORGANIC LIGHT EMITTING DEVICE

(75) Inventors: Tae Whan Kim, Seoul (KR); Hyun Sung Bang, Seoul (KR); Dong Chul Choo, Seoul (KR)

(73) Assignees: INDUSTRY-UNIVERSITY COOPERATION FOUNDATION HANYANG UNIVERSITY, Seoul (KR); TOP ENGINEERING CO., LTD, Gumi-si, Gyeongbuk (KR)

( * ) Notice: Subject to any disclaimer, the term of this patent is extended or adjusted under 35 U.S.C. 154(b) by 210 days.

(21) Appl. No.: 14/130,090

(22) PCT Filed: Jun. 15, 2012

(86) PCT No.: PCT/KR2012/004767
§ 371 (c)(1),
(2), (4) Date: Apr. 3, 2014

(87) PCT Pub. No.: WO2013/002501
PCT Pub. Date: Jan. 3, 2013

(65) Prior Publication Data
US 2014/0231766 A1    Aug. 21, 2014

(30) Foreign Application Priority Data
Jun. 30, 2011 (KR) .................. 10-2011-0065150

(51) Int. Cl.
*H01L 51/52* (2006.01)
*H01L 51/00* (2006.01)
(Continued)

(52) U.S. Cl.
CPC ........... *H01L 51/5203* (2013.01); *B82Y 10/00* (2013.01); *H01L 51/0048* (2013.01); *H01L 51/502* (2013.01); *H01L 51/5296* (2013.01)

(58) Field of Classification Search
CPC ............ H01L 51/5296; H01L 51/0048; H01L 51/502; H01L 51/5203
See application file for complete search history.

(56) References Cited

U.S. PATENT DOCUMENTS 6,121,726 A * 9/2000 Codama ............. H01L 51/5036
                                              313/504
2005/0024305 A1 * 2/2005 Park .................... H01L 27/3244
                                              345/82

(Continued)

FOREIGN PATENT DOCUMENTS

CN      1851953 A    10/2006
CN      1860828 A    11/2006

(Continued)

OTHER PUBLICATIONS

Raffaella Capelli, et al; "Organic light-emitting transistors with an efficiency that outperforms the equivalent light-emitting diodes", Nature Materials, vol. 9, pp. 496-503; Published online May 2, 2010.

(Continued)

*Primary Examiner* — Phat X Cao
*Assistant Examiner* — Nga Doan
(74) *Attorney, Agent, or Firm* — Ladas & Parry LLP

(57) ABSTRACT

Provided is an organic light emitting device including a nano composite layer. The organic light emitting device adopts a nano composite layer including an insulator and light emitting nano-particles within a device, thereby simultaneously insulating a control electrode and changing the color of light emitted from a light emitting layer, thereby improving external quantum efficiency. Further, the amount of electron holes and electrons injected into the light emitting layer may be adjusted through a voltage applied to the control electrode so as to secure a stable current when the device is operated. In addition, when compared to a conventional light (Continued)

emitting device, the surface area of positive and negative electrodes may be reduced so as to reduce reflectance with respect to external light.

8 Claims, 3 Drawing Sheets

(51) Int. Cl.
    *H01L 51/50*    (2006.01)
    *B82Y 10/00*    (2011.01)

(56) References Cited

U.S. PATENT DOCUMENTS

2006/0237731 A1    10/2006    Furukawa et al.
2007/0121129 A1*    5/2007    Eida ........................ B82Y 20/00
                                                                   358/1.9

FOREIGN PATENT DOCUMENTS

KR    20080113020 A    12/2008
KR      100878225 B1    1/2009

OTHER PUBLICATIONS

International Search Report mailed Nov. 30, 2012; PCT/KR2012/004767.

* cited by examiner

ORGANIC LIGHT EMITTING DEVICE

TECHNICAL FIELD

The present invention relates to a light emitting device, and more specifically, to an organic light emitting device.

BACKGROUND ART

In broad terms, photoelectric devices are devices that convert light energy to electric energy, or vice versa. For example, photoelectric devices include organic light emitting devices, inorganic light emitting devices, and solar cells.

In particular, among photoelectric devices, organic light emitting devices (organic light emitting diodes: OLEDs) have recently been in the spotlight according to a growing demand for flat panel displays.

An organic light emitting device is a device which converts electric energy to light energy by applying a current to an organic light emitting material. An organic light emitting device may have a structure in which a functional organic thin film is inserted between an anode and a cathode.

FIG. 1 is a cross-sectional view schematically showing an example of an existing organic light emitting device.

Referring to FIG. 1, the existing organic light emitting device includes an anode 20 as a transparent electrode layer, formed on a transparent substrate 10. An organic thin film layer 30 which sequentially includes a hole injection layer 31 and a hole transport layer 33, an organic light emitting layer 35, and an electron transport layer 37 and an electron injection layer 39, is deposited on the anode 20. A cathode 40 is formed on the organic thin film layer 30. Here, when a voltage is applied between the anode 20 and the cathode 40, electrons (e$^-$) generated from the cathode 40 move to the organic light emitting layer 35 through the electron injection layer 39 and the electron transport layer 37. In addition, holes (H$^+$) generated from the anode 20 move to the organic light emitting layer 35 through the hole injection layer 31 and the hole transport layer 33. Accordingly, electrons and holes collide and recombine to generate light in the organic light emitting layer 35.

Thus, the existing organic light emitting device is a current-driven device which controls light emitting efficiency using an organic thin film layer of several tens of nanometers which controls electron transport and hole transport, and adopts a diode structure. However, there are problems in that it is difficult to accurately control the thickness of each layer configuring the organic thin film, and light emitting characteristics are degraded due to the non-uniform thickness of the organic thin film.

In addition, since a metal thin film used as the cathode has a high surface light reflectance due to characteristics of the metal, external light flowing into the device may be reflected. There is a problem in that the reflected external light interferes with light generated from the organic light emitting device and degrades color expression.

To solve those problems, there are methods in which interference with the light emitted from the organic light emitting device is reduced by additionally attaching a polarizing plate or using a non-reflective electrode. However, since the polarizing plate cuts off portions of light generated from the inside, it degrades display efficiency.

Further, the existing organic light emitting device is formed on a substrate in which a driver device is already fabricated, and needs an additional driver circuit for stably driving a device as a current-driven device. However, the additional driver circuit reduces a light emitting area of a device, and thereby reduces an aperture ratio. In addition, since a driving voltage is increased to compensate for a decrease in brightness due to the reduction of the light emitting area, the life of device is shortened.

DISCLOSURE

Technical Problem

The present invention is directed to provide an organic light emitting device which achieves its own active operation, and has an improved structure and performance to change a color of emitted light.

Technical Solution

In accordance with an aspect of the present invention, an organic light emitting device is provided. The organic light emitting device includes a substrate, a control electrode formed on the substrate, a nano-composite layer formed on the control electrode, a light emitting layer formed on the nano-composite layer, an anode formed on the light emitting layer, and a cathode spaced apart from the anode and formed on the light emitting layer. The nano-composite layer insulates the control electrode and changes a color of light generated from the light emitting layer, and the control electrode controls the amount of charges injected into the light emitting layer.

The nano-composite layer may include an insulator and light emitting nano-particles.

The insulator may include polymethyl methacrylate (PMMA), polyimide (PI), polyvinyl alcohol (PVA), or polyvinyl pyrrolidone (PVP).

The insulator may include LiF, $SiO_2$, SiN, $WO_3$, $Al_2O_3$, $BaTiO_2$, $ZrTiO_2$, $PbTiO_3$, $Ba(Zr_xTi_{1-x})O_3$, or $Pb(Zr_xTi_{1-x})O_3$.

The light emitting nano-particles may include quantum dots or a fluorescent material.

The fluorescent material may include at least one selected from yellow, red, green, and blue fluorescent materials.

The control electrode may be faulted of a metal.

The control electrode may be formed of at least one selected from carbon nano-tubes (CNTs), graphene, graphene oxide, Al-doped ZnO, Ga-doped ZnO, In-doped ZnO, (In, Ga)-doped ZnO, Mg-doped ZnO, Al- or Ga-doped MgO, Sn-doped $In_2O_3$, F-doped $SnO_2$, and Nb-doped $TiO_2$.

The organic light emitting device may further include a hole transport layer interposed between a part on the light emitting layer and the anode, and an electron transport layer interposed between a part on the light emitting layer and the cathode and spaced apart from the hole transport layer.

Advantageous Effects

According to embodiments of the present invention, since an organic light emitting device achieves its own active operation by employing a transistor structure, the number of transistors of a peripheral circuit can be reduced. Accordingly, there is an effect in that an aperture ratio of a device is increased and a driving voltage is decreased.

In addition, it is easy to ensure current stability during device operation by controlling charges injected into a light emitting layer using a voltage of a control electrode. Further, by adopting a light-color changing insulating layer which performs roles of insulation and light color change, attenuation of external quantum efficiency is low, and the cost of manufacturing process can be reduced.

However, the technical effects of the present invention are not limited to the above disclosure; other technical effects may become apparent to those of ordinary skill in the art based on the following descriptions.

MODES FOR CARRYING OUT THE INVENTION

Figure 1:
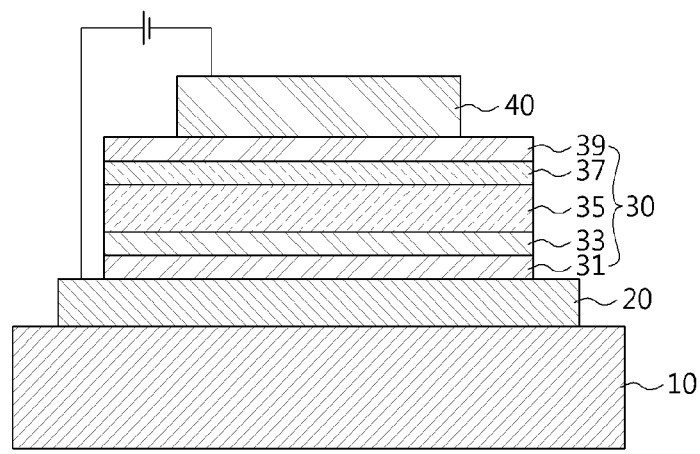
FIG. 1 is a cross-sectional view schematically showing an example of an existing organic light emitting device.

Hereinafter, embodiments of the present invention will be fully described with reference to the accompanying drawings. The present invention may, however, be embodied in different forms and should not be construed as limited to the embodiments set forth herein. The present invention should be understood to include all the equivalents and substitutions included in the spirit and scope of the present invention.

It will be understood that when a layer is referred to as being "on" another layer or a substrate, it can be directly on the other layer or substrate, or a third layer may be interposed therebetween. In addition, directional terms, such as "an upper side," "an upper (portion)," and "an upper surface" can be understood to have meanings such as "a lower side," "a lower (portion)," and "a lower surface" depending on their criteria. That is, spatial direction terms should be construed as relative directions, and should not be limitedly construed as absolute directions.

In the drawings, the sizes and relative sizes of layers and regions may be exaggerated for clarity. Like numerals refer to like elements throughout the specification.

Figure 2:
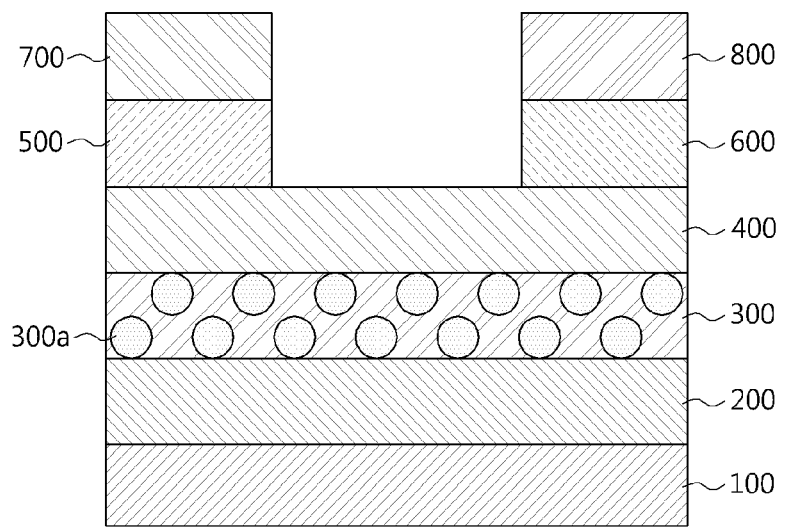
FIG. 2 is a cross-sectional view showing an organic light emitting device in accordance with an embodiment of the present invention.

FIG. 2 is a cross-sectional view showing an organic light emitting device in accordance with an embodiment of the present invention.

Referring to FIG. 2, the organic light emitting device of the present invention includes a structure in which a substrate 100, a control electrode 200, a nano-composite layer 300 including light emitting nano-particles 300a, a light emitting layer 400, a hole transport layer 500, an electron transport layer 600, an anode 700, and a cathode 800 are sequentially stacked from a bottom.

The substrate 100 disposed at the bottom may be a transparent substrate. For example, the substrate 100 may be a non-magnetic inorganic substrate, such as glass, quartz, $Al_2O_3$, SiC, and GaAs, or a non-magnetic organic substrate having a flexible property, such as polyethylene terephthalate (PET), polystyrene (PS), polyimide (PI), polyvinyl chloride (PVC), polyvinyl pyrrolidone (PVP), and polyethylene (PE).

The control electrode 200 may be formed on the substrate 100. The control electrode 200 may function to control charges injected into the light emitting layer 400. That is, the control electrode 200 may receive power from the outside, and form an electric field with one selected from the anode 700 and the cathode 800. For example, the control electrode 200 may receive a negative voltage and form an electric field with the anode 700 to help holes to be easily transported. In addition, the control electrode 200 may receive a positive voltage and form an electric field with the cathode 800 to help electrons to be easily transported.

Meanwhile, the control electrode 200 may receive a high voltage to restrict movement of one of electrons and holes, and thereby control generation of light emitted from the light emitting layer 400. For example, the control electrode 200 may receive a high positive voltage from the outside and attract electrons to prevent the electrons from combining with holes. Accordingly, generation of light from the light emitting layer 400 may be limited. In addition, the control electrode 200 may receive a high negative voltage from the outside and attract holes to prevent the holes from combining with electrons. Accordingly, generation of light from the light emitting layer 400 may be limited.

As described above, since the control electrode 200 functions to control charges injected into the light emitting layer 400, there is an advantage in that stability of current is ensured during the operation of the device.

The control electrode 200 may reflect or transmit light emitted from the light emitting layer 400, and may be formed of a material having superior conductivity. For example, the control electrode 200 may be formed of a metal having high light reflectance, such as Al, Ag, or Ti, in order to reflect the light. In addition, the control electrode 200 may be formed of carbon nano-tubes (CNTs), graphene, graphene oxide, doped ZnO (Al-doped ZnO, (AZO), Ga-doped ZnO (GZO), In-doped ZnO, (IZO), In/Ga-doped ZnO, (IGZO), or Mg-doped ZnO (MZO)), Al- or Ga-doped MgO, Sn-doped $In_2O_3$, F-doped $SnO_2$, or Nb-doped $TiO_2$, which has transparence to transmit the light.

In addition, the control electrode 200 may be formed of a multilayered electrode in which a plurality of layers are stacked depending on its purpose of use. For example, the control electrode 200 may have a structure in which a metal thin film is interposed between transparent oxide thin films, such as AZO/Ag/AZO, AZO/Au/AZO, AZO/Ti/AZO, GZO/Ag/GZO, GZO/Au/GZO, GZO/Ti/GZO, IZO/Ag/IZO, IZO/Au/IZO, IZO/Ti/IZO, $CuAlO_2$/Ag/$CuAlO_2$, $CuAlO_2$/Au/$CuAlO_2$, $CuAlO_2$/Ti/$CuAlO_2$, ITO/Ag/ITO, ZnO/Ag/ZnO, ITO/Ti/ITO, ZnO/Au/ZnO, ZnS/Ag/ZnS, ZnS/Au/ZnS, $TiO_2$/Ag/$TiO_2$, $TiO_2$/Au/$TiO_2$, $WO_3$/Ag/$WO_3$, $WO_3$/Au/$WO_3$, $MoO_3$/Ag/$MoO_3$, or $MoO_3$/Au/$MoO_3$.

The nano-composite layer 300 may be formed on the control electrode 200. The nano-composite layer 300 may include an insulator and the light emitting nano-particles 300a. Accordingly, the nano-composite layer 300 may insulate the control electrode 200 and, at the same time, change a color of light implemented in the light emitting layer 400 to another color.

The insulator may be an organic polymer insulator, such as polymethyl methacrylate (PMMA), polyimide (PI), polyvinyl alcohol (PVA), and polyvinyl pyrrolidone (PVP), or an inorganic insulator, such as LiF, $SiO_2$, SiN, $WO_3$, $Al_2O_3$, $BaTiO_2$, $ZrTiO_2$, $PbTiO_3$, $Ba(Zr_xTi_{1-x})O_3$, and $Pb(Zr_xTi_{1-x})O_3$.

The light emitting nano-particles 300a may include quantum dots or a fluorescent material. The quantum dots refer to small size particles having a quantum confinement effect, which have a diameter of about 1 nm to 10 nm. In addition, the quantum dots have a homogeneous single structure, or a core-shell dual structure. By controlling the size of quantum dots, the color of light implemented from the light emitting layer 400 can be easily changed into various colors, for example, red, green, or blue. In addition, when a blue light or ultraviolet light is emitted from the light emitting layer 400, yellow or red, green, and blue may be mixed therewith to implement a white light by various sizes of quantum dots included in the nano-composite layer 300.

For example, the single-structured quantum dots may be at least one selected from the group consisting of MgO, MgS, MgSe, MgTe, CaO, CaS, CaSe, CaTe, SrO, SrS, SrSe, SrTe, BaO, BaS, BaSe, BaTE, ZnO, CuO, $Cu_2O$, ZnS, ZnSe, ZnTe, CdO, CdS, CdSe, CdTe, HgO, HgS, HgSe, HgTe, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $GeO_2$, $SnO_2$, SnS, SnSe, SnTe, PbO, $Pb_O2$, PbS, PbSe, PbTe, AlN, AlP, AlAs, AlSb, GaN, GaP, GaAs, GaSb, InN, InP, InAs, and InSb.

In addition, the core-shell dual-structured quantum dots may be at least one selected from the group consisting of CdTe/CdSe, CdSe/ZnTe, CdTe/ZnS, CdSe/ZnS, CdTe/ZnSe, InP/ZnSe, InP/ZnS, InP/ZnTe, CdSe/ZnSe, InP/GaAs, InGaAs/GaAs, PbTe/PbS, $CuInS_2$/ZnS, Co/CdSe, Zn/ZnO, and Ag/$TiO_2$.

Meanwhile, the fluorescent material may be an organic or inorganic fluorescent material having a yellow, red, green, or blue color. As an example, when the light emitting layer 400 emits a blue light, the fluorescent material may include a yellow fluorescent material to implement a white light. In addition, when the light emitting layer 400 emits ultraviolet light, the fluorescent material may include all of a red fluorescent material, a green fluorescent material, and a blue fluorescent material to implement a white light.

For example, the yellow fluorescent material may be a YAG-based fluorescent material including at least one selected from YAG:Ce, TbYAG:Ce, GdYAG:Ce, and GdTbYAG:Ce, or a silicate-based fluorescent material including at least one selected from methyl silicate, ethyl silicate, magnesium aluminum silicate, and aluminum silicate.

The red fluorescent material may be at least one selected from $(Sr,Ca,Ba,Mg)P_2O_7:Eu^{2+}$, $CaLa_2S_4:Ce^{3+}$, $SrY_2S_4:Eu^{2+}$, $(Ca,Sr)S:Eu^{2+}$, $SrS:Eu^{2+}$, $Y_2O_3:Eu^{3+}$, $YVO_4:Eu^{3+}$, and $Y_2O_2S:Eu^{3+}$.

The green fluorescent material may be at least one selected from $YBO_3:Ce^{3+}$, $BaMgAl_{10}O_{17}:Eu^{2+}$, $(Sr,Ca,Ba)(Al,Ga)_2S_4:Eu^{2+}$, $Ca_8Mg(SiO_4)_4Cl_2:Eu^{2+}$, $Ba_2SiO_4:Eu^{2+}$, $(Ba,Sr)_2SiO_4:Eu^{2+}$, $Ba_2(Mg,Zn)Si_2O_7:Eu^{2+}$, and $(Ba,Sr)Al_2O_4:Eu^{2+}$.

The blue fluorescent material may be at least one selected from $(Sr,Mg,Ca)_{10}(PO_4)_6Cl_2:Eu^{2+}$, $BaMgAl_{10}O_{17}:Eu^{2+}$, and $BaMg_2Al_{16}O_{27}:Eu^{2+}$.

As described above, when the nano-composite layer 300 which functions to insulate the control electrode 200 and change the color of light is formed in a device, there is an advantage in that a light emitting device for lighting is easily implemented due to less attenuation of external quantum efficiency.

The light emitting layer 400 is formed on the nano-composite layer 300. The light emitting layer 400 may receive holes from the anode 700, and electrons from the cathode 800, to emit light generated by electron-hole combination.

The light emitting layer 400, if necessary, may be formed of a light emitting material alone, or a light emitting material doped into a host material. For example, the light emitting material may be a conventional organic compound, such as $Alq_3$, MADN, mCP, $Irppy_3$, FIrpic, UGH2, UGH3, UGH4, DPVBi, DCM, DCM2, TPBi, PtOEP, or rubrene. In addition, the light emitting material may be $Alq_3$ as the host material, doped with a material such as N-methyl quinacridone (MQD).

The hole transport layer 500 is disposed at a part on the light emitting layer 400. The hole transport layer 500 may receive holes from the anode 700 and transfer the holes to the light emitting layer 400.

The electron transport layer 600 is formed to be spaced a predetermined distance from the hole transport layer 500. The electron transport layer 600 may receive electrons from the cathode 800 and transfer the electrons to the light emitting layer 400.

In this case, the hole transport layer 500 controls the moving speed of holes, and the electron transport layer 600 controls the moving speed of electrons. Thereby, the electrons or holes can be easily injected into the light emitting layer 400.

For example, the hole transport layer 500 may include one selected from a conventional small-molecular organic material, such as α-NPB, TPD, s-TAD, or MTADATA, and a polymer organic material, such as PEDOT, PSS, PPV, PVK, or PVK. In addition, the electron transport layer 600 may include one selected from PBD, TAZ, and spiro-PBD, which are conventionally used.

The anode 700 is disposed on the hole transport layer 500. The anode 700 may receive power from the outside to supply holes to the hole transport layer 500.

The cathode 800 is disposed on the electron transport layer 600. The cathode 800 may receive power from the outside to supply electrons to the electron transport layer 600.

In addition, the anode 700 and the cathode 800 may form an electric field to induce movement of holes or electrons, in relation to the control electrode 200.

The anode 700 may be formed of a material having a high work function which allows hole injection, and the cathode 800 may be formed of a material having a lower work function compared to the anode 700.

As an example, the anode 700 and the cathode 800 may be formed of a metal or metal oxide having high conductivity. For example, the metal may be Al, Mo, Au, Ag, etc. which facilitates charge injection. The metal oxide may be a transparent oxide, such as ITO, IGO, or IZO.

Meanwhile, a hole injection layer (not shown) for facilitating hole injection may be interposed between the anode 700 and the hole transport layer 500, and an electron injection layer (not shown) for facilitating electron injection may be interposed between the cathode 800 and the electron transport layer 600.

FIGS. 3A to 3E are process charts showing a method of fabricating an organic light emitting device in accordance with an embodiment of the present invention.

Figure 3A:
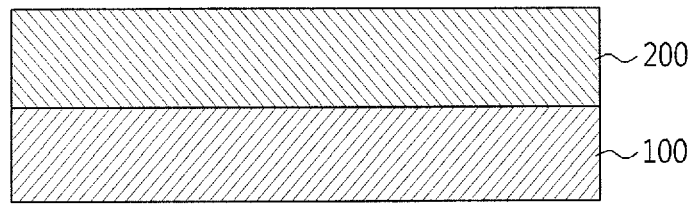
FIGS. 3A to 3E are process charts showing a method of fabricating an organic light emitting device in accordance with an embodiment of the present invention.

Referring to FIG. 3A, a control electrode 200 is formed on a substrate 100. The substrate 100 is preferably transparent. For example, the substrate 100 may be a non-magnetic inorganic material substrate which is transparent and solid, or a non-magnetic organic material substrate which is transparent and flexible.

A cleaning process may be performed for removing impurities of the substrate 100. In this case, an ultrasonic cleaning process in which cleaning is sequentially performed in acetone, ethanol, and deionized water may be used.

Next, the control electrode 200 is formed on the substrate 100. The control electrode 200 may be a transparent electrode having a high light transmittance, or a metal having a high light reflectance.

The control electrode 200 is formed of a multilayered electrode in which a plurality of layers are stacked depending on its purpose of use. The multilayered electrode may have a structure in which a metal thin film is interposed between transparent oxides. The control electrode 200 may be formed by a spin coating method.

Figure 3B:
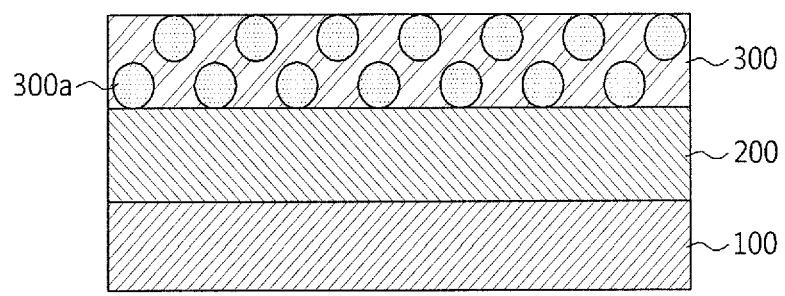

Referring to FIG. 3B, a nano-composite layer 300 is formed on the control electrode 200.

The nano-composite layer 300 may include light emitting nano-particles 300a, and the light emitting nano-particles 300a may include quantum dots or a fluorescent material. The quantum dots refer to small size particles having a quantum confinement effect, which have a diameter of about 1 nm to 10 nm. The quantum dots have a homogeneous single structure, or a core-shell dual structure.

The fluorescent material may be an organic or inorganic fluorescent material having a yellow, red, green, or blue color.

As an manufacturing example, the nano-composite layer 300 may be formed by forming a solution in which an organic solvent including an insulator and the light emitting nano-particles 300a are mixed on the control electrode 200 using a spin coating or transfer printing process, and then solidifying the solution through a dehydration or elimination process.

Figure 3C:
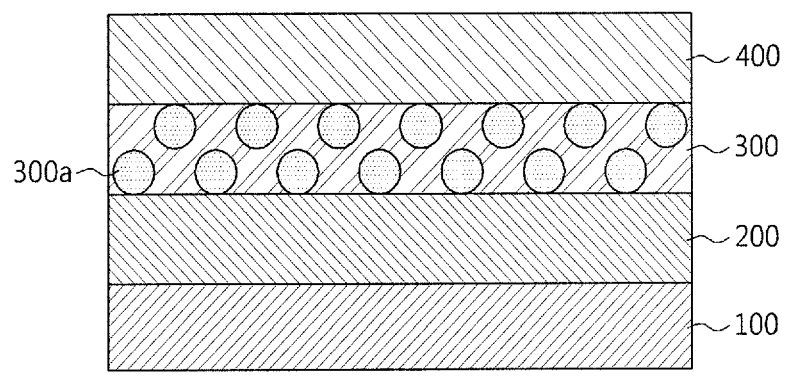

Referring to FIG. 3C, a light emitting layer 400 is formed on the nano-composite layer 300. The light emitting layer 400 may be formed using a light emitting material alone, or a light emitting material doped into a host material. The light emitting material may be an organic compound.

When the light emitting material is a small molecular organic compound, the light emitting layer 400 may be formed by a vacuum vapor deposition method. On the other hand, when the light emitting material is a polymer compound, the light emitting layer 400 may be formed by nozzle coating, spin coating, inkjet printing, or roll printing.

Figure 3D:
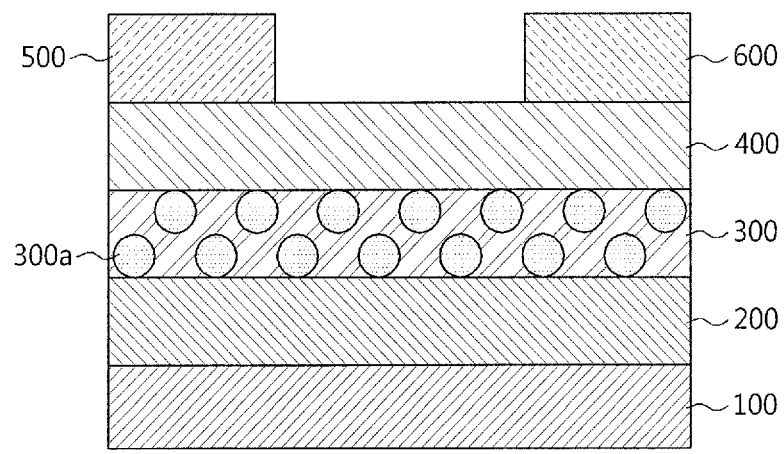

Referring to FIG. 3D, a hole transport layer 500 is formed at a part on the light emitting layer 400, and an electron transport layer 600 is formed to be spaced a predetermined distance from the hole transport layer 500. The hole transport layer 500 and the electron transport layer 600 may be formed by a vacuum vapor deposition method, a spin coating method, etc.

As a manufacturing process, when the hole transport layer 500 is formed of a polymer compound such as PPV, the hole transport layer 500 may be formed at a part on the light emitting layer 400 by spin-coating a precursor solution including a PPV precursor polymer and an organic solvent, performing a heat treatment at a constant temperature in a nitrogen gas atmosphere, and then patterning using a photolithography process and an etching process using a patterned mask.

Figure 3E:
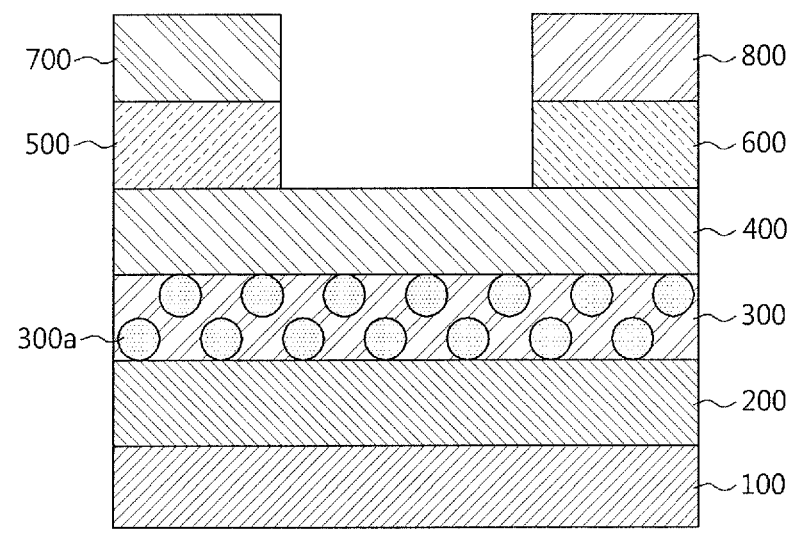

Referring to FIG. 3E, an anode 700 is formed on the hole transport layer 500, and a cathode 800 is formed on the electron transport layer 600.

The anode 700 may be formed of a material having a high work function which allows hole injection, and the cathode 800 may be formed of a material having a lower work function compared to the anode 700.

As a manufacturing process, the anode 700 and the cathode 800 may be formed by depositing a metal layer or a metal oxide layer using a vacuum vapor deposition method or a spin coating method, and then patterning the metal or metal oxide layer using a photolithography process and an etching process using a patterned mask.

The invention claimed is:

1. An organic light emitting device, comprising:
   a substrate;
   a control electrode formed on the substrate;
   a nano-composite layer formed on the control electrode;
   a light emitting layer formed on the nano-composite layer;
   an anode formed on the light emitting layer; and
   a cathode spaced apart from the anode and formed on the light emitting layer,
   wherein the nano-composite layer insulates the control electrode and changes a color of light generated from the light emitting layer, and the control electrode controls the amount of charges injected into the light emitting layer, and
   wherein the nano-composite layer includes an insulator and light emitting nano-particles.

2. The organic light emitting device of claim 1, wherein the insulator includes polymethyl methacrylate (PMMA), polyimide (PI), polyvinyl alcohol (PVA), or polyvinyl pyrrolidone (PVP).

3. The organic light emitting device of claim 1, wherein the insulator includes LiF, $SiO_2$, SiN, $WO_3$, $Al_2O_3$, $BaTiO_2$, $ZrTiO_2$, $PbTiO_3$, $Ba(Zr_xTi_{1-x})O_3$, or $Pb(Zr_xTi_{1-x})O_3$.

4. The organic light emitting device of claim 1, wherein the light emitting nano-particles include quantum dots or a fluorescent material.

5. The organic light emitting device of claim 4, wherein the fluorescent material includes at least one selected from yellow, red, green, and blue fluorescent materials.

6. The organic light emitting device of claim 1, wherein the control electrode is formed of a metal.

7. The organic light emitting device of claim 1, wherein the control electrode is formed of at least one selected from carbon nano-tubes (CNTs), graphene, graphene oxide, Al-doped ZnO, Ga-doped ZnO, In-doped ZnO, (In, Ga)-doped ZnO, Mg-doped ZnO, Al- or Ga-doped MgO, Sn-doped $In_2O_3$, F-doped $SnO_2$, and Nb-doped $TiO_2$.

8. The organic light emitting device of claim 1, further comprising:
   a hole transport layer interposed between a part on the light emitting layer and the anode; and
   an electron transport layer interposed between a part on the light emitting layer and the cathode and spaced apart from the hole transport layer.

* * * * *